(12) United States Patent
Shibata

(10) Patent No.: US 11,442,695 B2
(45) Date of Patent: Sep. 13, 2022

(54) PRODUCT-SUM OPERATION DEVICE, NEUROMORPHIC DEVICE, AND METHOD FOR DETERMINING MALFUNCTION IN PRODUCT-SUM OPERATION DEVICE

(71) Applicant: TDK CORPORATION, Tokyo (JP)

(72) Inventor: Tatsuo Shibata, Tokyo (JP)

(73) Assignee: TDK CORPORATION, Tokyo (JP)

( * ) Notice: Subject to any disclaimer, the term of this patent is extended or adjusted under 35 U.S.C. 154(b) by 343 days.

(21) Appl. No.: 16/766,426

(22) PCT Filed: Dec. 12, 2018

(86) PCT No.: PCT/JP2018/045714
§ 371 (c)(1),
(2) Date: May 22, 2020

(87) PCT Pub. No.: WO2019/131137
PCT Pub. Date: Jul. 4, 2019

(65) Prior Publication Data
US 2021/0034331 A1 Feb. 4, 2021

(30) Foreign Application Priority Data
Dec. 28, 2017 (JP) .............................. JP2017-254700

(51) Int. Cl.
*G01R 31/50* (2020.01)
*G06F 7/544* (2006.01)
(Continued)

(52) U.S. Cl.
CPC ........... *G06F 7/5443* (2013.01); *G01R 31/50* (2020.01); *G06N 3/04* (2013.01); *G06N 3/0635* (2013.01); *H01L 43/02* (2013.01); *H01L 43/10* (2013.01)

(58) Field of Classification Search
CPC ....... G06F 7/5443; G01R 31/50; G01R 31/52; G06N 3/0481; G11C 7/1006;
(Continued)

(56) References Cited

U.S. PATENT DOCUMENTS

2018/0350432 A1 12/2018 Sasaki
2019/0171418 A1 6/2019 Morie et al.
2020/0257501 A1* 8/2020 Yabuuchi .............. G06F 7/5443

FOREIGN PATENT DOCUMENTS

JP 5160304 B2 3/2013
WO 2017/183573 A1 10/2017
WO 2018/034163 A1 2/2018

OTHER PUBLICATIONS

Chen et al., Optimized Learning Scheme for Grayscale Image Recognition in a RRAM Based Analog Neuromorphic System, 2015 IEEE, p. 17.7.1 to p. 17.7.4.
(Continued)

*Primary Examiner* — Tan V Mai
(74) *Attorney, Agent, or Firm* — Oliff PLC

(57) ABSTRACT

A product-sum operation device includes a product operator, a sum operator, and a malfunction determiner. The product operator includes a plurality of product operation elements (10AA) to (10AC), and each of the plurality of product operation elements (10AA) to (10AC) is a resistance change element. The sum operator includes an output detector that detects the sum of outputs from the plurality of product operation elements (10AA) to (10AC). The malfunction determiner determines that a malfunction has occurred when the sum detected by the output detector exceeds a specified value. The specified value is a value equal to or greater than a maximum value of the sum that can be detected by the output detector when the plurality of product operation elements (10AA) to (10AC) all operate normally.

15 Claims, 5 Drawing Sheets

(51) Int. Cl.
G06N 3/04 (2006.01)
H01L 43/02 (2006.01)
H01L 43/10 (2006.01)
G06N 3/063 (2006.01)

(58) Field of Classification Search
CPC ....... G11C 11/161; G11C 11/18; G11C 11/54; G11C 13/0021; G11C 13/0026; G11C 29/50008; H01L 27/2463; H01L 21/8239; H01L 27/105; H01L 27/22; H01L 43/08; H01L 45/06
USPC .......................................................... 706/38
See application file for complete search history.

(56) References Cited

OTHER PUBLICATIONS

Burr et al., Neuromorphic computing using non-volatile memory, Advances in Physics:X, 2017, vol. 2, No. 1, pp. 89 to 124.
Feb. 19, 2019 International Search Report issued in International Patent Application No. PCT/JP2018/045714.

* cited by examiner

PRODUCT-SUM OPERATION DEVICE,
NEUROMORPHIC DEVICE, AND METHOD
FOR DETERMINING MALFUNCTION IN
PRODUCT-SUM OPERATION DEVICE

TECHNICAL FIELD

The present invention relates to a product-sum operation device, a neuromorphic device, and a method for determining a malfunction in the product-sum operation device. Priority is claimed on Japanese Patent Application No. 2017-254700, filed Dec. 28, 2017, the content of which is incorporated herein by reference.

BACKGROUND ART

In the related art, a learning scheme optimized for grayscale image recognition in an RRAM (registered trademark)-based analog neuromorphic system is known (see, for example, Non-Patent Literature 1). This literature describes development of an analog neuromorphic system on the basis of an assembled resistance switching memory array. This literature proposes a new training scheme to optimize the performance of analog systems by utilizing segmented synaptic behaviors. This literature also applies the scheme to grayscale image recognition.

Research has also been conducted to realize a neural network imitating a nervous system by using an array of resistance change elements. A neuromorphic device (NMD) performs a product-sum operation to product weights and sum values from the previous stage to the next stage. Thus, development of various types of product-sum operation devices, each of which combines a plurality of resistance change elements whose resistances change continuously, performs product operations on input signals using their resistance values as weights, and performs sum operation to obtain the sum of currents output from the resistance change elements, and NMDs using the product-sum operation devices has been promoted.

CITATION LIST

Patent Literature

[Patent Literature 1]
PCT International Publication No. WO2017/183573

Non-Patent Literature

[Non-Patent Literature 1]
Zhe Chen et al., "Optimized Learning Scheme for Grayscale Image Recognition in a RRAM Based Analog Neuromorphic System," 2015, IEEE, p. 17.7.1-p. 17.7.4

SUMMARY OF INVENTION

Technical Problem

However, Non-Patent Literature 1 does not discuss a technique for detecting a malfunction that may greatly impair the performance of a neural network. If a resistance change element malfunctions and the resistance thereof decreases, the weight of the malfunctioning resistance change element may greatly affect the network during product-sum operation. Therefore, in the neural network, it is important to accurately detect a malfunction of a resistance change element due to short-circuiting.

In view of the above problems, it is an object of the present invention to provide a product-sum operation device, a neuromorphic device, and a method for determining a malfunction in the product-sum operation device which can, when applied to a neural network, accurately detect an element malfunction that may greatly impair the performance of the neural network upon the occurrence of the element malfunction.

Solution to Problem

A product-sum operation device of an aspect of the present invention includes a product operator, a sum operator, and a malfunction determiner, wherein the product operator includes a plurality of product operation elements, each of the plurality of product operation elements is a resistance change element, the sum operator includes an output detector configured to detect a sum of outputs from the plurality of product operation elements, the malfunction determiner is configured to determine that a malfunction has occurred when the sum detected by the output detector exceeds a specified value, and the specified value is a value equal to or greater than a maximum value of the sum that can be detected by the output detector when the plurality of product operation elements all operate normally.

In the product-sum operation device of an aspect of the present invention, the resistance change element may have a write terminal, a common terminal, and a read terminal.

In the product-sum operation device of an aspect of the present invention, the resistance change element may be a magnetoresistive effect element exhibiting a magnetoresistive effect, and the magnetoresistive effect element may include a magnetization free layer having a domain wall, a magnetization fixed layer whose magnetization direction is fixed, and a nonmagnetic layer sandwiched between the magnetization free layer and the magnetization fixed layer.

In the product-sum operation device of an aspect of the present invention, the product operator may include at least a first column having the plurality of product operation elements and a second column having a plurality of product operation elements, the sum operator may include at least a first output detector configured to detect a sum of outputs from the plurality of product operation elements in the first column and a second output detector configured to detect a sum of outputs from the plurality of product operation elements in the second column, and the product-sum operation device may further include a function replacer configured to, when the malfunction determiner has determined that the first column has malfunctioned, cause the plurality of product operation elements in the second column to perform product operations that the plurality of product operation elements in the first column have performed before the malfunction of the first column.

The product-sum operation device of an aspect of the present invention may further include a malfunction location-identifying unit configured to identify, when the malfunction determiner has determined that the plurality of product operation elements have malfunctioned, a malfunctioning product operation element among the plurality of product operation elements, and an input blocker configured to block an input to the malfunctioning product operation element when the malfunction determiner has determined that the plurality of product operation elements have malfunctioned, wherein the malfunction location-identifying unit may be configured to identify the malfunctioning product operation element by inputting a signal to the plurality of product operation elements through an output side of the plurality of product operation elements.

An aspect of the present invention is a neuromorphic device including the product-sum operation device.

The neuromorphic device of an aspect of the present invention may further include a hidden layer that uses an activation function, wherein the activation function may be set such that an output value from the activation function becomes zero when a value input to the activation function is equal to or greater than a threshold value.

A neuromorphic device of an aspect of the present invention includes the product-sum operation device, wherein the product-sum operation device may further include an output blocker configured to block, when the malfunction determiner has determined that the plurality of product operation elements have malfunctioned, outputs from the plurality of product operation elements determined to have malfunctioned.

In the neuromorphic device of an aspect of the present invention, a resistance value of each of the plurality of product operation elements during normal operation and a resistance value of each of the plurality of product operation elements during a malfunction may differ by three or more orders of magnitude.

A neuromorphic device of an aspect of the present invention is a neuromorphic device including the product-sum operation device, wherein the resistance change element may be a magnetoresistive effect element exhibiting a magnetoresistive effect, the magnetoresistive effect element may include a magnetization free layer having a domain wall, a magnetization fixed layer whose magnetization direction is fixed, and a nonmagnetic layer sandwiched between the magnetization free layer and the magnetization fixed layer, and a thickness of the nonmagnetic layer may be 2.5 nm or more.

In the neuromorphic device of an aspect of the present invention, the magnetization free layer may be a perpendicular magnetization film selected from the group consisting of a Co/Pt multilayer film, a Co/Pd multilayer film, and a CoCrPt alloy film.

In the neuromorphic device of an aspect of the present invention, the output detector may be configured to detect an output current value from the plurality of product operation elements.

In the neuromorphic device of an aspect of the present invention, the output detector may be configured to detect a charge output from the plurality of product operation elements.

An aspect of the present invention is a method for determining a malfunction in a product-sum operation device including a product operator and a sum operator, wherein the product operator includes a plurality of product operation elements, each of the plurality of product operation elements is a resistance change element, the method includes a detection step of detecting a sum of outputs from the plurality of product operation elements, and a determination step of determining that a malfunction has occurred when the sum detected in the detection step exceeds a specified value, and the specified value is a value equal to or greater than a maximum value of the sum that can be detected when the plurality of product operation elements all operate normally.

Advantageous Effects of Invention

According to the present invention, it is possible to provide a product-sum operation device, a neuromorphic device, and a method for determining a malfunction in the product-sum operation device which can, when applied to a neural network, accurately detect a malfunction that may greatly impair the performance of the neural network.

DESCRIPTION OF EMBODIMENTS

Hereinafter, embodiments of a product-sum operation device, a neuromorphic device, and a method for determining a malfunction in the product-sum operation device according to the present invention will be described with reference to the drawings.

<First Embodiment> (where Resistance Change Elements are Magnetoresistive Effect Elements)

Figure 1:
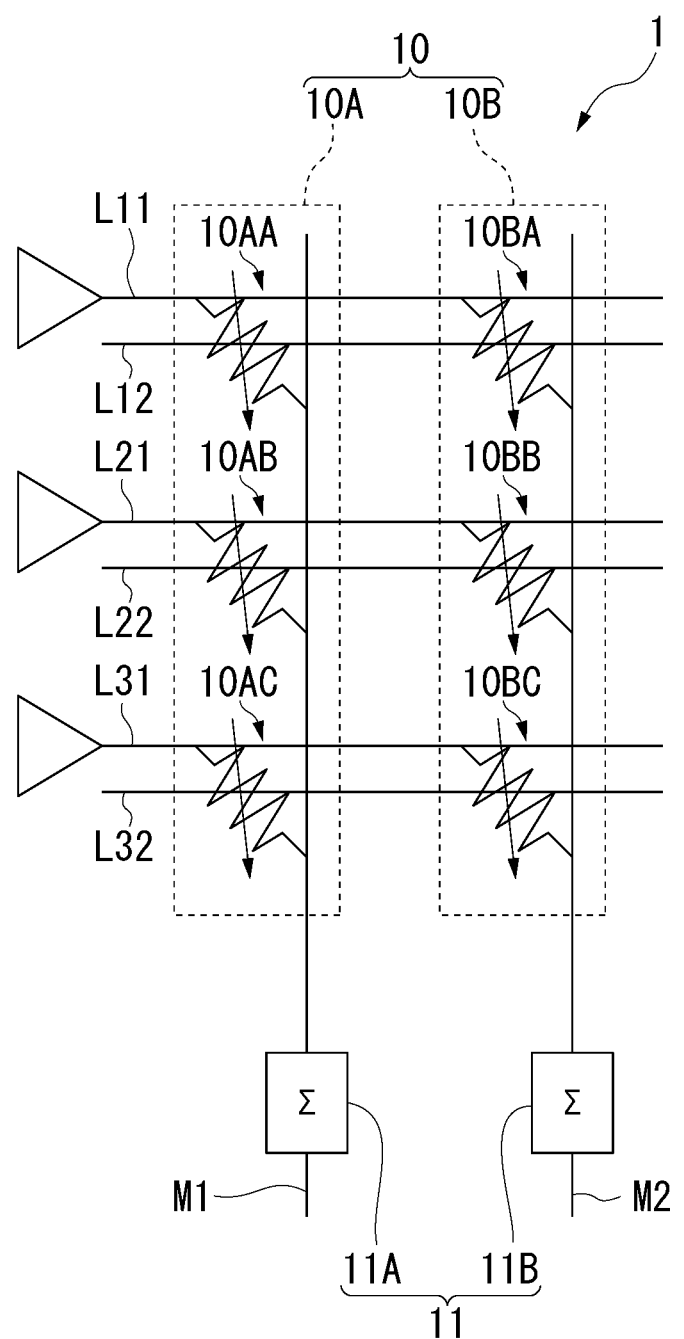
FIG. 1 is a diagram showing an example of a partial configuration of a product-sum operation device according to a first embodiment.
Figure 2:
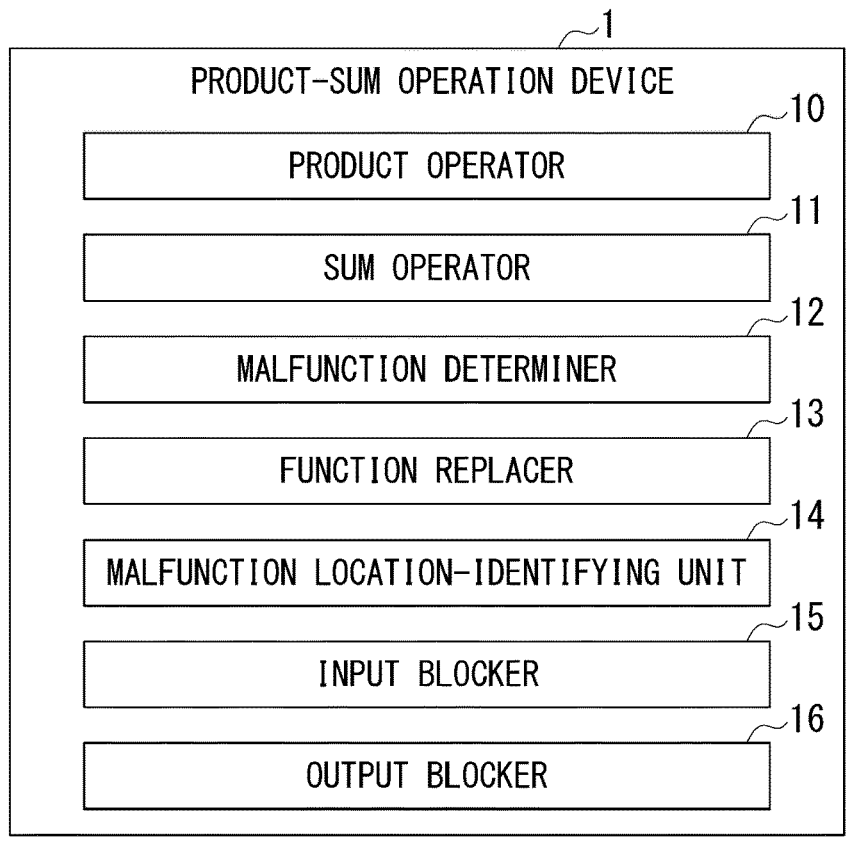
FIG. 2 is a diagram showing an example of an overall configuration of the product-sum operation device of the first embodiment.

FIG. 1 is a diagram showing an example of a partial configuration of a product-sum operation device 1 of a first embodiment. FIG. 2 is a diagram showing an example of an overall configuration of the product-sum operation device 1 of the first embodiment.

In the example shown in FIGS. 1 and 2, the product-sum operation device 1 of the first embodiment includes a product operator 10, a sum operator 11, a malfunction determiner 12, a function replacer 13, a malfunction location-identifying unit 14, an input blocker 15, and an output blocker 16. The product operator 10 includes a column 10A and a column 10B.

In the example shown in FIG. 1, the product operator 10 includes two columns 10A and 10B. However, the product operator 10 may include only one column and may also include three or more columns 10A, 10B, . . . .

In the example shown in FIG. 1, the column 10A includes a product operation element 10AA, a product operation element 10AB, and a product operation element 10AC. The column 10B includes a product operation element 10BA, a product operation element 10BB, and a product operation element 10BC.

In the example shown in FIG. 1, the column 10A includes three product operation elements 10AA, 10AB, and 10AC, and the column 10B includes three product operation elements 10BA, 10BB, and 10BC. However, the column 10A may include a plurality of product operation elements other than three and the column 10B may include a plurality of product operation elements other than three.

In the example shown in FIG. 1, each of the plurality of product operation elements 10AA to 10AC and 10BA to 10BC is a resistance change element having a read terminal, a write terminal, and a common terminal.

The read terminals of the product operation elements 10AA and 10BA are connected to a line L11. The write terminals of the product operation elements 10AA and 10BA are connected to a line L12.

The read terminals of the product operation elements 10AB and 10BB are connected to a line L21. The write terminals of the product operation elements 10AB and 10BB are connected to a line L22.

The read terminals of the product operation elements 10AC and 10BC are connected to a line L31. The write terminals of the product operation elements 10AC and 10BC are connected to a line L32.

The common terminals of the product operation elements 10AA, 10AB, and 10AC are connected to a line M1. The common terminals of the product operation elements 10BA, 10BB, and 10BC are connected to a line M2.

The sum operator 11 includes an output detector 11A that detects the sum of outputs from the product operation elements 10AA, 10AB, and 10AC, and an output detector 11B that detects the sum of outputs from the product operation elements 10BA, 10BB, and 10BC. The output detector 11A is disposed on the line M1. The output detector 11B is disposed on the line M2.

In the example shown in FIG. 1, the output detector 11A detects output current values from the product operation elements 10AA, 10AB, and 10AC, and the output detector 11B detects output current values from the product operation elements 10BA, 10BB, and 10BC. In another example, the output detector 11A may detect outputs charges from the product operation elements 10AA, 10AB, and 10AC, and the output detector 11B may detect outputs charges from the product operation elements 10BA, 10BB, and 10BC.

Resistance change elements used as the product operation elements in the present invention are elements whose electrical resistance reversibly changes in response to an external stimulus (such as a current, a voltage, or a magnetic field). Examples of the resistance change elements include a resistance change memory (RRAM) element, a phase-change memory (PCRAM) element, an anisotropic magnetoresistance effect (AMR) element, a tunnel magnetoresistance effect (TMR) element, and a giant magnetoresistance effect (GMR) element.

When the sum detected by the output detector 11A exceeds a specified value, the malfunction determiner 12 determines that an output current increase malfunction has occurred in at least one of the plurality of product operation elements 10AA to 10AC included in the column 10A. Also, when the sum detected by the output detector 11B exceeds the specified value, the malfunction determiner 12 determines that an output current increase malfunction has occurred in at least one of the plurality of product operation elements 10BA to 10BC included in the column 10B.

Figure 3:
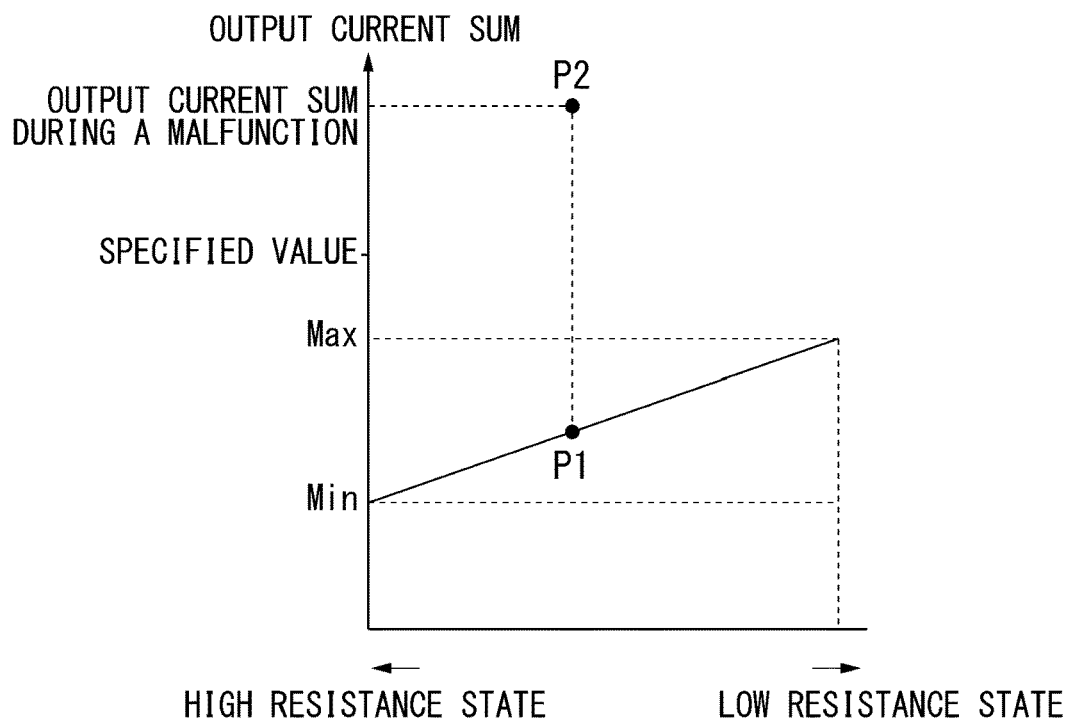
FIG. 3 is a diagram illustrating a sum detected by an output detector and a specified value.

FIG. 3 is a diagram illustrating the sum detected by the output detector 11A and the specified value. In FIG. 3, the vertical axis indicates the sum of output currents of the plurality of product operation elements 10AA to 10AC detected by the output detector 11A, the specified value, and the like. The horizontal axis indicates states (magnitudes of resistance values) of the product operation elements 10AA to 10AC.

When the plurality of product operation elements 10AA to 10AC operate normally and the resistance values of the product operation elements 10AA to 10AC are the highest, the sum of output currents of the plurality of product operation elements 10AA to 10AC detected by the output detector 11A is a minimum value Min.

When the plurality of product operation elements 10AA to 10AC operate normally, the sum of output currents of the plurality of product operation elements 10AA to 10AC detected by the output detector 11A increases as the resistance values of the product operation elements 10AA to 10AC decrease.

When the plurality of product operation elements 10AA to 10AC operate normally and the resistance values of the product operation elements 10AA to 10AC are the lowest, the sum of output currents of the plurality of product operation elements 10AA to 10AC detected by the output detector 11A is a maximum value Max.

The specified value is set to a value greater than the maximum value Max. That is, the specified value is equal to or greater than the maximum value Max of the sum that can be detected by the output detector 11A when the plurality of product operation elements 10AA to 10AC all operate normally.

In the example shown in FIG. 3, in the state of a point P1, the sum of output currents of the product operation elements 10AA to 10AC detected by the output detector 11A does not exceed the specified value. Therefore, the malfunction determiner 12 determines that an output current increase malfunction has not occurred in any of the plurality of product operation elements 10AA to 10AC included in the column 10A.

On the other hand, in the state of a point P2, the sum of output currents of the product operation elements 10AA to 10AC detected by the output detector 11A exceeds the specified value. Therefore, the malfunction determiner 12 determines that an output current increase malfunction has occurred in at least one of the plurality of product operation elements 10AA to 10AC included in the column 10A.

Specifically, in the example shown in FIGS. 1 and 3, each of the product operation elements 10AA to 10AC (and the product operation elements 10BA to 10BC) is a magnetoresistive effect element exhibiting a magnetoresistive effect. The resistance values of the plurality of product operation elements 10AA to 10AC during normal operation and the resistance values of the plurality of product operation elements 10AA to 10AC during a malfunction may differ by three or more orders of magnitude.

Figure 4:
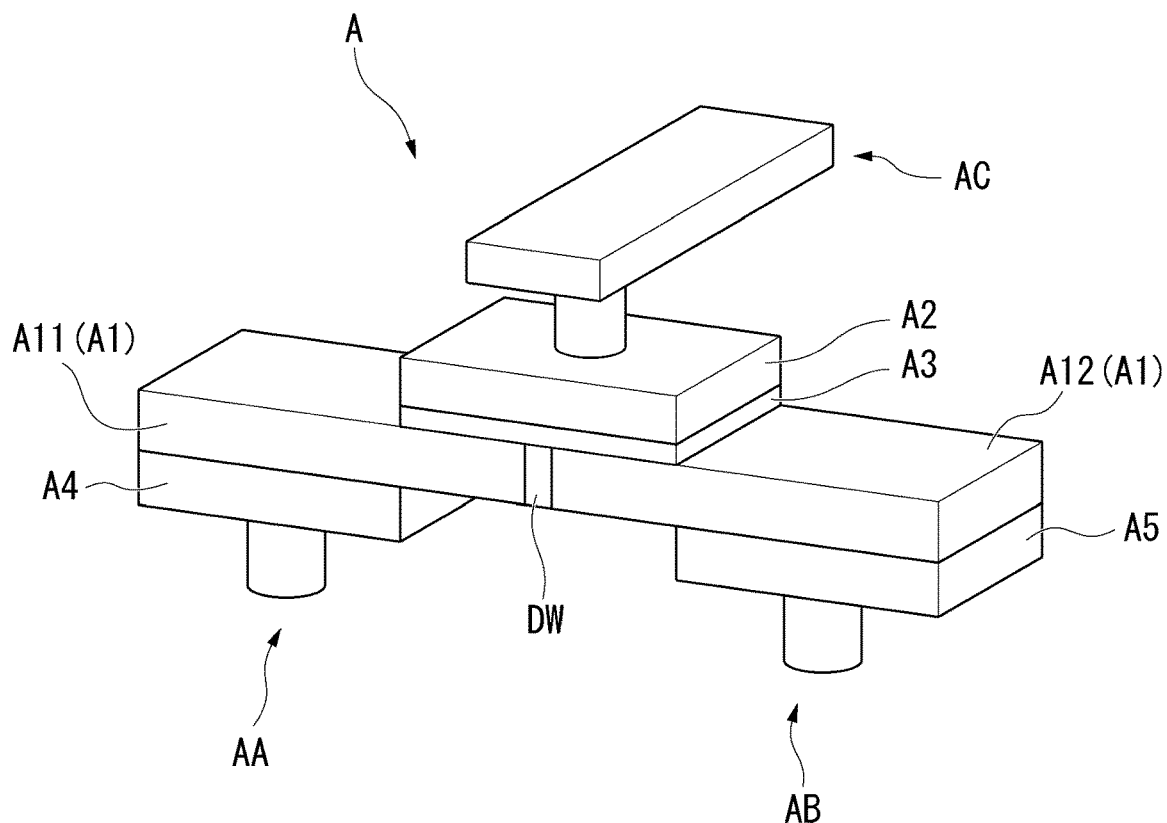
FIG. 4 is a perspective view showing an example of a magnetoresistive effect element that constitutes each of a plurality of product operation elements of the product-sum operation device of the first embodiment.

FIG. 4 is a perspective view showing an example of a magnetoresistive effect element A that constitutes each of the plurality of product operation elements 10AA to 10AC and 10BA to 10BC of the product-sum operation device 1 of the first embodiment.

In the example shown in FIG. 4, the magnetoresistive effect element A includes a magnetization free layer A1 having a domain wall DW, a magnetization fixed layer A2 whose magnetization direction is fixed, and a nonmagnetic layer A3. The nonmagnetic layer A3 is sandwiched between the magnetization free layer A1 and the magnetization fixed layer A2. The magnetization free layer A1 has a first region A11 on one side of the domain wall DW and a second region A12 on the other side of the domain wall DW. The first region A11 is disposed with a write terminal AA. The second region A12 is disposed with a common terminal AB. The magnetization fixed layer A2 is disposed with a read terminal AC.

The amount of movement (movement distance) of the domain wall DW can be variably controlled by adjusting the magnitude and duration of a write current that flows between the write terminal AA and the common terminal AB. The amount of movement (movement distance) of the domain wall DW can be set with the magnitude and duration of the write current, for example, using the number of pulses or the pulse width. When the area of a portion where the magnetization directions of the magnetization fixed layer A2 and the magnetization free layer A1 are parallel (or antiparallel) continuously changes by driving (moving) the domain wall DW, the ratio between the area proportion of the portion where the magnetization directions are parallel and the area proportion of the portion where the magnetization directions are antiparallel continuously changes, thus obtaining a nearly linear resistance change in the magnetoresistive effect element.

Further, data can be read by flowing current between the read terminal AC and the common terminal AB and detecting a resistance corresponding to the ratio between the area proportion of the portion where the magnetization directions are parallel and the area proportion of the portion where the magnetization directions are antiparallel (see, for example, Patent Literature 1).

[Magnetization Fixed Layer A2]

The magnetization fixed layer A2 is a layer in which the magnetization is oriented in a first direction (for example, leftward in FIG. 4) and fixed. Here, the magnetization being fixed means that the magnetization direction does not change (the magnetization is fixed) before and after writing using a write current.

In the example shown in FIG. 4, the magnetization fixed layer A2 is an in-plane magnetization film whose magnetization has in-plane magnetic anisotropy (an in-plane easy magnetization axis). The magnetization fixed layer A2 is not limited to the in-plane magnetization film and may be a perpendicular magnetization film having perpendicular magnetic anisotropy (a perpendicular easy magnetization axis).

When the magnetization fixed layer A2 is an in-plane magnetization film, it has a high MR ratio (magnetoresistive change rate) and is hardly affected by a spin transfer torque (STT) during reading, and thus can increase the reading voltage. On the other hand, when it is desired to miniaturize the element, it is preferable to use a perpendicular magnetization film with a large magnetic anisotropy and a small demagnetizing field.

A known material can be used for the magnetization fixed layer A2. For example, a metal selected from the group consisting of Cr, Mn, Co, Fe, and Ni and an alloy that contains at least one of these metals and exhibits ferromagnetism can be used. An alloy containing these metals and at least one element of B, C, and N can also be used. Specific examples include Co—Fe and Co—Fe—B.

A Heusler alloy such as $Co_2FeSi$ can also be used for the magnetization fixed layer A2. The Heusler alloy includes an intermetallic compound having a chemical composition of $X_2YZ$, where X is a transition metal element or a noble metal element of Co, Fe, Ni or Cu groups in the periodic table, Y is a transition metal element of Mn, V, Cr or Ti groups, which may be of the same elemental species as X, and Z is a typical element of Groups III to V. Examples include $Co_2FeSi$, $Co_2MnSi$, and $Co_2Mn_{1-a}Fe_aAl_bSi_{1-b}$.

The magnetization fixed layer A2 may have a synthetic structure including a ferromagnetic layer and a nonmagnetic layer or a synthetic structure including an antiferromagnetic layer, a ferromagnetic layer, and a nonmagnetic layer. In the latter, the magnetization direction of the magnetization fixed layer A2 is strongly held by the antiferromagnetic layer in the synthetic structure. Therefore, the magnetization of the magnetization fixed layer A2 is hardly affected by the outside.

When the magnetization of the magnetization fixed layer A2 is oriented in the XY plane (the magnetization fixed layer A2 is an in-plane magnetization film), it is preferable to use, for example, NiFe. On the other hand, when the magnetization of the magnetization fixed layer A2 is oriented in the Z direction (the magnetization fixed layer A2 is a perpendicular magnetization film), it is preferable to use, for example, a Co/Ni laminated film or a Co/Pt laminated film. For example, when the magnetization fixed layer A2 is made of $[Co(0.24\ nm)/Pt(0.16\ nm)]_6/Ru(0.9\ nm)/[Pt(0.16\ nm)/Co(0.16\ nm)]_4/Ta(0.2\ nm)/FeB(1.0\ nm)$, this forms a perpendicular magnetization film.

[Nonmagnetic Layer A3]

The nonmagnetic layer A3 is disposed on a lower surface of the magnetization fixed layer A2. In the magnetoresistive effect element A, a change in the magnetization state of the magnetization free layer A1 with respect to the magnetization fixed layer A2 is read as a change in resistance value via the nonmagnetic layer A3. That is, the magnetization fixed layer A2, the nonmagnetic layer A3, and the magnetization free layer A1 function as the magnetoresistive effect element A. When the nonmagnetic layer A3 is made of an insulator, the configuration is similar to that of the tunnel magnetoresistive (TMR) element. When the nonmagnetic layer 2 is made of a metal, the configuration is similar to that of a giant magnetoresistive effect (GMR) element.

A known material that can be used for the nonmagnetic layer of the magnetoresistive effect element A can be used as a material of the nonmagnetic layer A3. When the nonmagnetic layer A3 is made of an insulator (i.e., when it is a tunnel barrier layer), $Al_2O_3$, $SiO_2$, MgO, $MgAl_2O_4$, $ZnAl_2O_4$, $MgGa_2O_4$, $ZnGa_2O_4$, $MgIn_2O_4$, $ZnIn_2O_4$, a multilayer film or a mixed composition film of these materials, or the like can be used as a material of the nonmagnetic layer A3. Besides these materials, a material in which a part of Al, Si, or Mg is substituted with Zn, Be, or the like can also be used. Among these, MgO and $MgAl_2O_4$ can have a large magnetoresistance ratio (MR ratio) since these are materials capable of realizing coherent tunneling. On the other hand, when the nonmagnetic layer 2 is made of a metal, Cu, Al, Ag, or the like can be used as a material of the nonmagnetic layer A3.

When the nonmagnetic layer A3 is made of an insulator (i.e., when it is a tunnel barrier layer), the thickness thereof is, for example, 2.5 nm or more.

[Magnetization Free Layer A1]

The magnetization free layer A1 corresponds to a domain wall drive layer of a domain wall drive type (motion type) MRAM.

The magnetization free layer A1 is made of a ferromagnetic material and the magnetization direction inside thereof can be reversed. The magnetization free layer A1 has a first region A11 in which the magnetization is oriented in a second direction opposite to that of the magnetization fixed layer A2, a second region A12 in which the magnetization is oriented in the same direction as the first direction, and a domain wall DW that forms the interface between these regions. The magnetization directions of the first region A11 and the second region A12 are opposite to each other across the domain wall DW. The domain wall DW is moved by changing the composition ratio of the first region A11 and the second region A12 in the magnetization free layer A1.

A known material can be used as a material of the magnetization free layer A1 and in particular a soft magnetic material can be applied. For example, a metal selected from the group consisting of Cr, Mn, Co, Fe, and Ni, an alloy containing at least one of these metals, an alloy containing these metals and at least one element of B, C, and N, or the like can be used. Specific examples of the material for the magnetization free layer A1 include Co—Fe, Co—Fe—B, and Ni—Fe.

A material having a small saturation magnetization can be used as a material of the magnetization free layer A1. For example, when a material having a small saturation magnetization such as (MnGa)As or (InFe)As or a Co/Tb multilayer film or GdFeCo is used, the domain wall DW of the magnetization free layer A1 can be driven with a small current density. Moreover, when these materials are used, the drive speed of the domain wall DW becomes slow.

A material with weak magnetic anisotropy such as NiFe gives a high drive speed to the domain wall DW and allows the domain wall DW to operate at a speed of 100 m/sec or more. That is, the domain wall DW moves a distance of 1 μm with a pulse of 10 nsec. Accordingly, to move the magnetization free layer A1 in an analog manner in the element, it is necessary to take measures such as applying a minute pulse using an expensive semiconductor circuit or making the magnetization free layer sufficiently long at the expense of the degree of integration. On the other hand, a material with a slow drive speed for the domain wall DW can form an analog memory even when a sufficiently long pulse current is applied or when the length of the magnetization free layer A1 is short.

When the magnetization free layer A1 is a perpendicular magnetization film, it is preferable that a perpendicular magnetization film selected from the group consisting of a Co/Pt multilayer film, a Co/Pd multilayer film, and a CoCrPt alloy film be used. A perpendicular magnetization film of $Mn_3X$ (X=Ga, Ge) or a multilayer magnetization film of Co/Ni or the like can also be used. These materials allow the domain wall DW to be driven even when the current density for driving the domain wall is small.

It is preferable that the extension length of the magnetization free layer A1 in the longitudinal direction be 60 nm or more. If the extension length of the magnetization free layer A1 is less than 60 nm, it tends to form a single magnetic domain and it is difficult to form a domain wall DW in the magnetization free layer A1.

The thickness of the magnetization free layer A1 is not particularly limited as long as it functions as a domain wall drive layer, and may be, for example, 2 nm to 60 nm. When the thickness of the magnetization free layer A1 is 60 nm or more, the possibility that a domain wall is formed in the stacking direction increases. However, whether or not a domain wall is formed in the stacking direction depends on a balance with the shape anisotropy of the magnetization free layer A1. If the thickness of the magnetization free layer A1 is less than 60 nm, it is unlikely that such a domain wall DW will be formed.

The magnetization free layer A1 may have a domain wall pinning portion which stops movement of the domain wall DW on a side of the layer. For example, by providing irregularities, a groove, a bulge, a constriction, a cutout, or the like at a position where it is desired to stop the movement of the domain wall DW of the magnetization free layer A1, it is possible to stop (pin) the movement of the domain wall. When the magnetization free layer A1 has a domain wall pinning portion, this can be configured such that the domain wall no longer moves unless a current of a threshold value or more flows, and the output signal is not analog and can be easily multi-valued.

For example, by forming domain wall pinning portions at intervals of a predetermined distance, the domain wall DW can be held more stably, enabling stable multi-valued recording and also enabling more stable reading of multi-valued output signals.

In the example shown in FIG. 4, in order to form the domain wall DW, a first magnetization supply layer A4 having a magnetization in the first direction which is the direction of the magnetization of the first region A11 and a second magnetization supply layer A5 having a magnetization in the second direction which is the direction of the magnetization of the second region A12 are disposed on both end portions of the magnetization free layer A1 that do not overlap the magnetization fixed layer A2 in plan view.

The same material as the ferromagnetic material that can be used for the magnetization fixed layer A2 can be used as a material of the first magnetization supply layer A4 and the second magnetization supply layer A5.

In the example shown in FIG. 4, in order to form the domain wall DW, the first magnetization supply layer A4 and the second magnetization supply layer A5 are used as layers whose magnetizations are fixed in both end portions of the magnetization free layer A1. However, a spin orbit torque (SOT) wiring that is in contact with the magnetization free layer A1 and extends in a direction crossing the longitudinal direction of the magnetization free layer A1 may also be used for one or both end portions. The spin orbit torque wiring is made of a material that generates a pure spin current by the spin Hall effect when a current flows.

With this configuration, a domain wall can be introduced into the magnetization free layer A1 by flowing a current through both ends of the spin orbit torque wiring without providing a magnetization supply layer as a layer with fixed magnetization. The domain wall can be moved by flowing a current through the magnetization free layer A1 via the spin orbit torque wiring.

In the example shown in FIG. 4, in order to form the domain wall DW, the first magnetization supply layer A4 and the second magnetization supply layer A5 are used as layers whose magnetizations are fixed in both end portions of the magnetization free layer A1. However, a magnetic field application wiring that is electrically insulated from the magnetization free layer A1 and extends in a direction crossing the magnetization free layer A1 may be used for one or both end portions. A magnetic field is generated by Ampere's law by flowing a current through the magnetic field application wiring. The direction of the generated magnetic field can be reversed with the direction of the current flowing through the magnetic field application wiring. Therefore, by disposing a magnetic field application wiring capable of supplying an in-plane magnetization to an end portion of the magnetization free layer A1, an in-plane magnetization with one of the in-plane magnetization directions that are opposite to each other can be supplied to the end portion of the magnetization free layer A1 according to the direction of a current flowing through the magnetic field application wiring. In addition, by disposing a magnetic field application wiring capable of supplying a perpendicular magnetization to an end portion of the magnetization free layer A1, a perpendicular magnetization with one of the perpendicular magnetization directions that are opposite to each other can be supplied to the end portion of the magnetization free layer A1 according to the direction of a current flowing through the magnetic field application wiring.

In the example shown in FIG. 4, in order to form the domain wall DW, the first magnetization supply layer A4 and the second magnetization supply layer A5 are used as layers whose magnetizations are fixed in both end portions of the magnetization free layer A1. However, a voltage application terminal that is connected to the magnetization free layer A1 via an insulating layer may be used for one or both end portions. When a voltage is applied between the magnetization fixed layer A2 and the voltage application terminal, a part of the magnetization of the magnetization free layer A1 is affected by the voltage. For example, when a voltage is applied as a pulse from the voltage application terminal, a part of the magnetization is oriented in a direction perpendicular to the magnetization direction of the magnetization free layer A1 during the voltage application and the magnetization of the magnetization free layer A1 is oriented in a first direction or a second direction opposite thereto when the voltage application has stopped. The magnetization oriented in the perpendicular direction falls into the first direction or the second direction opposite to the first direction with equal probabilities. Thus, by adjusting the timing, the number of times, and the period of applying the pulsed voltage, a part of the magnetization can become oriented into the second direction from the first direction.

A magnetic coupling layer may be provided between the magnetization free layer A1 and the nonmagnetic layer A3. The magnetic coupling layer is a layer that transfers the magnetization state of the magnetization free layer A1. A main function of the magnetization free layer A1 is a layer for driving the domain wall and it is not always possible to select a material suitable for the magnetoresistance effect generated between the magnetization fixed layer A1 and the magnetization free layer A1 sandwiching the nonmagnetic layer A2. In general, it is known that a ferromagnetic material having a BCC structure is good for the magnetization fixed layer A1 and the magnetic coupling layer to generate a coherent tunnel effect in the nonmagnetic layer A2. In particular, it is known that a large output can be obtained when a material having a composition of Co—Fe—B is formed through sputtering as a material of the magnetization fixed layer A1 and the magnetic coupling layer.

In the example shown in FIGS. 1 and 2, when the malfunction determiner 12 has determined that the column 10A has malfunctioned, the function replacer 13 causes the plurality of product operation elements 10BA to 10BC in the column 10B to operate product operations that the plurality of product operation elements 10AA to 10AC in the column 10A have operated before the malfunction of the column 10A. Specifically, the function replacer 13 sets, for example, the resistance values of the plurality of product operation elements 10BA to 10BC in the column 10B to the resistance values of the plurality of product operation elements 10AA to 10AC in the column 10A before the malfunction.

On the other hand, when the malfunction determiner 12 has determined that the column 10B has malfunctioned, the function replacer 13 causes the plurality of product operation elements 10AA to 10AC in the column 10A to operate product operations that the plurality of product operation elements 10BA to 10BC in the column 10B have operated before the malfunction of the column 10B. Specifically, the function replacer 13 sets, for example, the resistance values of the plurality of product operation elements 10AA to 10AC in the column 10A to the resistance values of the plurality of product operation elements 10BA to 10BC in the column 10B before the malfunction.

For example, when the malfunction determiner 12 has determined that some of the plurality of product operation elements 10AA to 10AC in the column 10A has malfunctioned, the malfunction location-identifying unit 14 determines which product operation element has malfunctioned among the plurality of product operation elements 10AA to 10AC. Specifically, the malfunction location-identifying unit 14 identifies which product operation element has malfunctioned by inputting signals to the plurality of product operation elements 10AA to 10AC through output sides (lower sides in FIG. 1) of the plurality of product operation elements 10AA to 10AC.

When the malfunction determiner 12 has determined that some of the plurality of product operation elements 10AA to 10AC in the column 10A has malfunctioned and, for example, the malfunction location-identifying unit 14 has identified that the product operation element 10AB has malfunctioned, the input blocker 15 blocks the input to the malfunctioning product operation element 10AB. As a result, it is possible to avoid an excessive current being output to the line M1 via the product operation element 10AB.

As an example of the input blocker 15 that blocks the input to the product operation element 10AB, the input blocker 15 includes a switch disposed between the read terminal AC (see FIG. 4) of the product operation element 10AB and the line L21. As another example of the input blocker 15 that blocks the input to the product operation element 10AB, the input blocker 15 includes a switch that blocks the inputs to the product operation elements 10AB and 10BB on the line L21.

Instead of the input blocker 15 blocking the input to the malfunctioning product operation element 10AB, the output blocker 16 may block, for example, outputs from the plurality of product operation elements 10AA to 10AC including the malfunctioning product operation element 10AB on the line M1.

Similarly, when the malfunction determiner 12 has determined that some of the plurality of product operation elements 10BA to 10BC in the column 10B has malfunctioned, the malfunction location-identifying unit 14 determines which product operation element has malfunctioned among the plurality of product operation elements 10BA to 10BC. Specifically, the malfunction location-identifying unit 14 identifies which product operation element has malfunctioned by inputting signals to the plurality of product operation elements 10BA to 10BC through output sides (lower sides in FIG. 1) of the plurality of product operation elements 10BA to 10BC.

When the malfunction determiner 12 has determined that some of the plurality of product operation elements 10BA to 10BC in the column 10B has malfunctioned and the malfunction location-identifying unit 14 has identified that the product operation element 10BC has malfunctioned, the input blocker 15 blocks the input to the malfunctioning product operation element 10BC. As a result, it is possible to avoid an excessive current being output to the line M2 via the product operation element 10BC.

Instead of the input blocker 15 blocking the input to the malfunctioning product operation element 10BC, the output blocker 16 may block, for example, outputs from the plurality of product operation elements 10BA to 10BC including the malfunctioning product operation element 10BC on the line M2.

Figure 5:
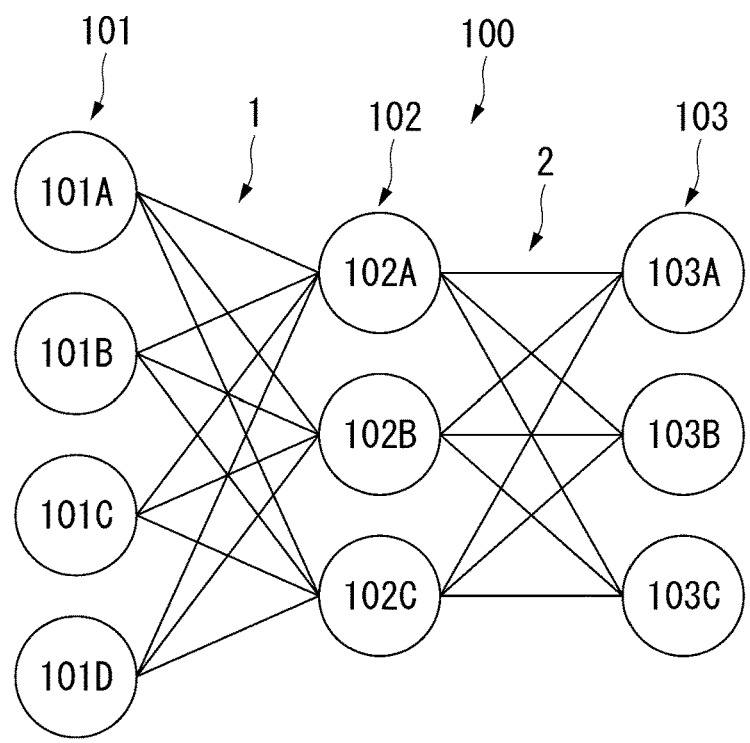
FIG. 5 is a diagram showing an exemplary application of the product-sum operation device of the first embodiment.

FIG. 5 is a diagram showing an exemplary application of the product-sum operation device 1 of the first embodiment.

In the example shown in FIG. 5, the product-sum operation device 1 of the first embodiment is applied to a neuromorphic device 100. The neuromorphic device 100 includes an input layer 101, a hidden layer 102, an output layer 103, the product-sum operation device 1 of the first embodiment, and a product-sum operation device 2. The product-sum operation device 2 includes a plurality of product operation elements, similar to the product-sum operation device 1 of the first embodiment shown in FIG. 1.

The input layer 101 includes, for example, four nodes 101A, 101B, 101C, and 101D. The hidden layer 102 includes, for example, three nodes 102A, 102B, and 102C. The output layer 103 includes, for example, three nodes 103A, 103B, and 103C.

The product-sum operation device 1 is disposed between the input layer 101 and the hidden layer 102 and connects the four nodes 101A, 101B, 101C, and 101D of the input layer 101 and the three nodes 102A, 102B, and 102C of the hidden layer 102. The product-sum operation device 1 changes weights by changing the resistance values of the product operation elements 10AA to 10AC and 10BA to 10BC shown in FIG. 1.

The product-sum operation device 2 is disposed between the hidden layer 102 and the output layer 103. The product-sum operation device 2 connects the three nodes 102A, 102B, and 102C of the hidden layer 102 and the three nodes 103A, 103B, and 103C of the output layer 103. The product-sum operation device 2 changes weights by changing the resistance values of the plurality of product operation elements.

The hidden layer 102 uses an activation function (for example, a sigmoid function).

Figure 6:
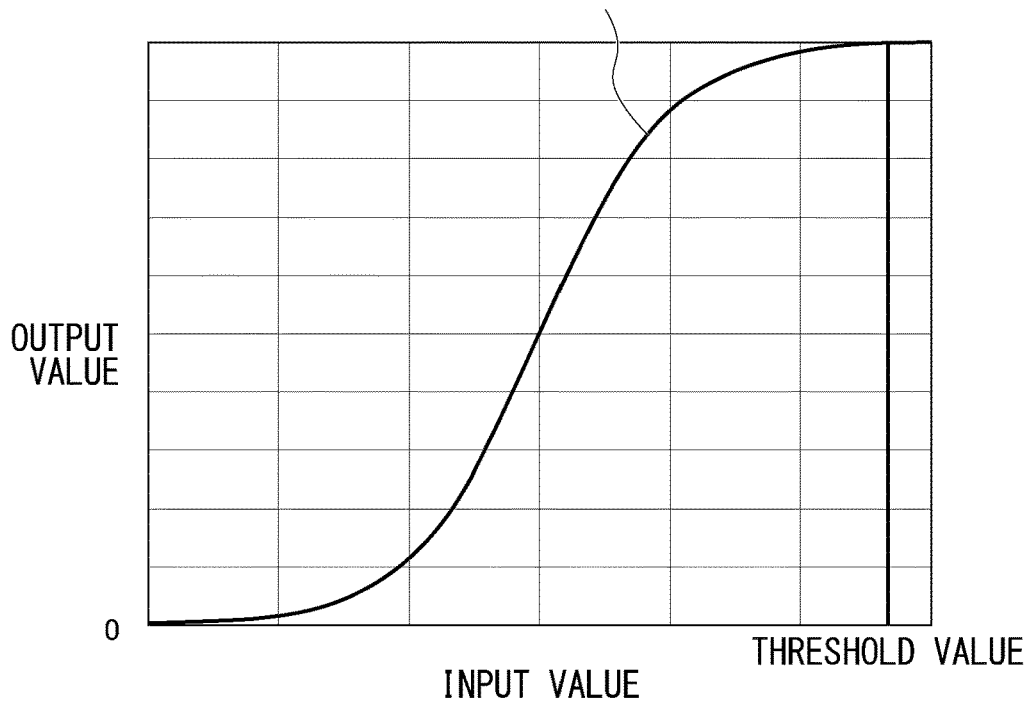
FIG. 6 is a diagram illustrating an activation function used in a hidden layer.

FIG. 6 is a diagram illustrating the activation function used in the hidden layer 102. In FIG. 6, the horizontal axis indicates a value input to the activation function and the vertical axis indicates an output value from the activation function.

In the example shown in FIG. 6, the activation function is set such that the output value from the activation function becomes zero when the value input to the activation function is equal to or greater than a threshold value.

That is, in the example shown in FIGS. 5 and 6, when a value equal to or greater than the threshold value (see FIG. 6) is input from the product-sum operation device 1 to the hidden layer 102, for example, due to a malfunction of the product-sum operation device 1, the hidden layer 102 outputs a value of zero as an output value. Therefore, it is possible to curb the possibility that the product-sum operation device 2 and the output layer 103 may be affected, for example, by the malfunction of the product-sum operation device 1.

Figure 7:
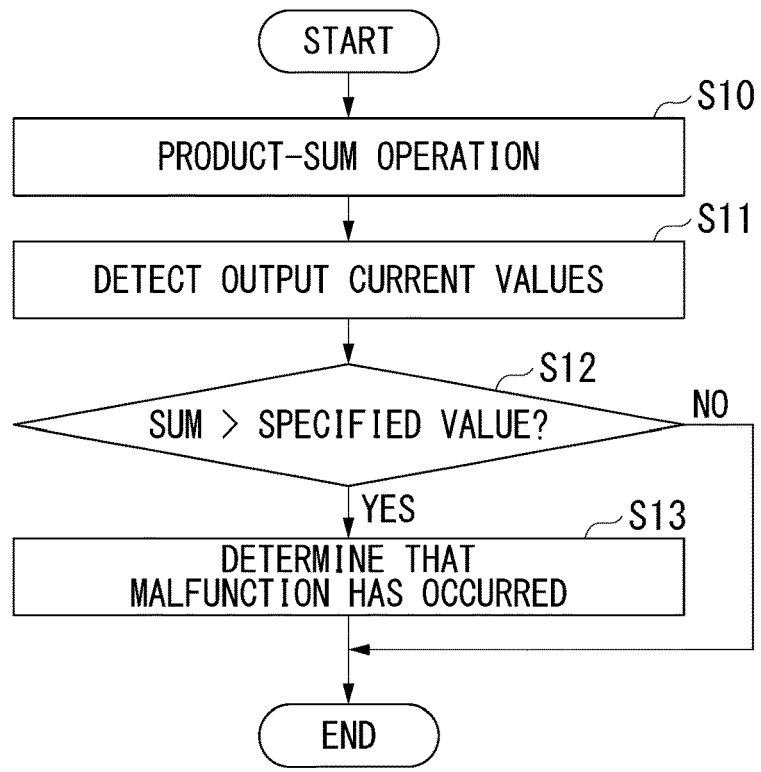
FIG. 7 is a flowchart showing an example of a process executed by the product-sum operation device of the first embodiment.

FIG. 7 is a flowchart showing an example of a process executed by the product-sum operation device 1 of the first embodiment.

In step S10, the product operator 10 and the sum operator 11 perform a product-sum operation.

In step S11, the output detector 11A detects output current values from the product operation elements 10AA, 10AB, and 10AC and the output detector 11B detects output current values from the product operation elements 10BA, 10BB, and 10BC.

In step S12, the malfunction determiner 12 determines whether or not the sum detected by the output detector 11A exceeds a specified value and determines whether or not the sum detected by the output detector 11B exceeds the specified value. When the sum detected by the output detector 11A exceeds the specified value or when the sum detected by the output detector 11B exceeds the specified value, the process proceeds to step S13. When the sum detected by the output detector 11A is equal to or less than the specified value and the sum detected by the output detector 11B is equal to or less than the specified value, the process shown in FIG. 7 ends.

In step S13, the malfunction determiner 12 determines that an output current increase malfunction has occurred in at least one of the plurality of product operation elements 10AA to 10AC included in the column 10A or determines that an output current increase malfunction has occurred in at least one of the plurality of product operation elements 10BA to 10BC included in the column 10B.

In intensive studies, the present inventor has found that the functions of the neuromorphic device 100 have deteriorated when the characteristics of the product operation elements 10AA to 10AC and 10BA to 10BC constituting the product-sum operation device 1 have changed for some reason (specifically, when the product operation elements 10AA to 10AC and 10BA to 10BC have malfunctioned).

In particular, the product-sum operation function of the product-sum operation device 1 and the performance of the neural network have been found to be greatly impaired when the product operation elements 10AA to 10AC and 10BA to 10BC have malfunctioned in a short-circuiting mode (that is, when an output current increase malfunction has occurred in the product operation elements 10AA to 10AC and 10BA to 10BC).

Specifically, in intensive studies, the present inventor has found that the product-sum operation function of the product-sum operation device 1 and the performance of the neural network have been more seriously impaired when an output current increase malfunction has occurred in the product operation elements 10AA to 10AC and 10BA to 10BC than when an output current decrease malfunction has occurred in the product operation elements 10AA to 10AC and 10BA to 10BC. This is because a large amount of current concentrates on the malfunctioning product operation element (resistance change element), whereby weights of the other product operation elements (currents from the other product operation elements) are ignored in the circuit.

Therefore, in the product-sum operation device 1 of the first embodiment, as described above, the malfunction determiner 12 determines that a malfunction has occurred in some of the plurality of product operation elements 10AA to 10AC that are resistance change elements when the sum detected by the output detector 11A exceeds the specified value and determines that a malfunction has occurred in some of the plurality of product operation elements 10BA to 10BC that are resistance change elements when the sum detected by the output detector 11B exceeds the specified value. The specified value is a value that is equal to or greater than a maximum value of the sum that can be detected by the output detector 11A when the plurality of product operation elements 10AA to 10AC all operate normally and that is also equal to or greater than a maximum value of the sum that can be detected by the output detector 11B when the plurality of product operation elements 10BA to 10BC all operate normally Therefore, according to the product-sum operation device 1 of the first embodiment, when applied to a neural network, it is possible to accurately detect a malfunction that may greatly impair the performance of the neural network (that is, an output current increase malfunction).

In the product-sum operation device 1 of the first embodiment, as described above, each of the plurality of product operation elements 10AA to 10AC and 10BA to 10BC is a magnetoresistive effect element A that has a write terminal AA, a common terminal AB, and a read terminal AC and exhibits a magnetoresistive effect. The magnetoresistive effect element A includes a magnetization free layer A1 having a domain wall DW, a magnetization fixed layer A2 whose magnetization direction is fixed, and a nonmagnetic layer A3 sandwiched between the magnetization free layer A1 and the magnetization fixed layer A2.

That is, in the product-sum operation device 1 of the first embodiment, elements with a great difference between the resistance value during normal operation and the resistance value during a malfunction (specifically, during an output current increase malfunction) are used as the plurality of product operation elements 10AA to 10AC and 10BA to 10BC.

Therefore, according to the product-sum operation device 1 of the first embodiment, it is possible to accurately detect a malfunction that may greatly impair the performance of the neural network as compared to when elements with a small difference between the resistance value during normal operation and the resistance value during a malfunction (specifically, during an output current increase malfunction) are used.

Further, in the product-sum operation device 1 of the first embodiment, as described above, when the malfunction determiner 12 has determined that the column 10A has malfunctioned, the plurality of product operation elements 10BA to 10BC in the column 10B perform product operations that the plurality of product operation elements 10AA to 10AC in the column 10A have performed before the malfunction of the column 10A. On the other hand, when the malfunction determiner 12 has determined that the column 10B has malfunctioned, the plurality of product operation elements 10AA to 10AC in the column 10A perform product operations that the plurality of product operation elements 10BA to 10BC in the column 10B have performed before the malfunction of the column 10B.

Therefore, according to the product-sum operation device 1 of the first embodiment, the performance of the neural network can be maintained even when the column 10A has malfunctioned or when the column 10B has malfunctioned.

In the product-sum operation device 1 of the first embodiment, as described above, when the malfunction determiner 12 has determined that some of the plurality of product operation elements 10AA to 10AC has malfunctioned, the malfunctioning one of the plurality of product operation elements 10AA to 10AC is identified and an input to the malfunctioning product operation element is blocked.

On the other hand, when the malfunction determiner 12 has determined that some of the plurality of product operation elements 10BA to 10BC has malfunctioned, the malfunctioning one of the plurality of product operation elements 10BA to 10BC is identified and an input to the malfunctioning product operation element is blocked.

Therefore, according to the product-sum operation device 1 of the first embodiment, it is possible to curb the possibility that the performance of the neural network may be greatly impaired as compared to when the input to the malfunctioning product operation element is not blocked.

Alternatively, in the product-sum operation device 1 of the first embodiment, as described above, when the malfunction determiner 12 has determined that some of the plurality of product operation elements 10AA to 10AC has malfunctioned, outputs from the plurality of product operation elements 10AA to 10AC determined to have malfunctioned are blocked.

On the other hand, when the malfunction determiner 12 has determined that some of the plurality of product operation elements 10BA to 10BC has malfunctioned, outputs from the plurality of product operation elements 10BA to 10BC determined to have malfunctioned are blocked.

Therefore, according to the product-sum operation device 1 of the first embodiment, it is possible to curb the possibility that the performance of the neural network may be greatly impaired as compared to when the outputs from the plurality of product operation elements 10AA to 10AC and 10BA to 10BC determined to have malfunctioned are not blocked.

Further, in the neuromorphic device 100 including the product-sum operation device 1 of the first embodiment, as described above, the activation function used in the hidden layer 102 is set such that the output value from the activation function becomes zero when the value input to the activation function is equal to or greater than a threshold value.

Therefore, according to the neuromorphic device 100 including the product-sum operation device 1 of the first embodiment, it is possible to curb the possibility that the product-sum operation device 2 and the output layer 103 may be affected, for example, by the malfunction of the product-sum operation device 1.

<Second Embodiment> (where Resistance Change Elements are General Variable Resistors)

Hereinafter, a second embodiment of the product-sum operation device of the present invention will be described.

The product-sum operation device 1 of the second embodiment is configured similar to the product-sum operation device 1 of the first embodiment described above, except for the points described below. Therefore, according to the product-sum operation device 1 of the second embodiment, the same effects as those of the product-sum operation device 1 of the first embodiment described above can be obtained except for the points described below.

Figure 8:
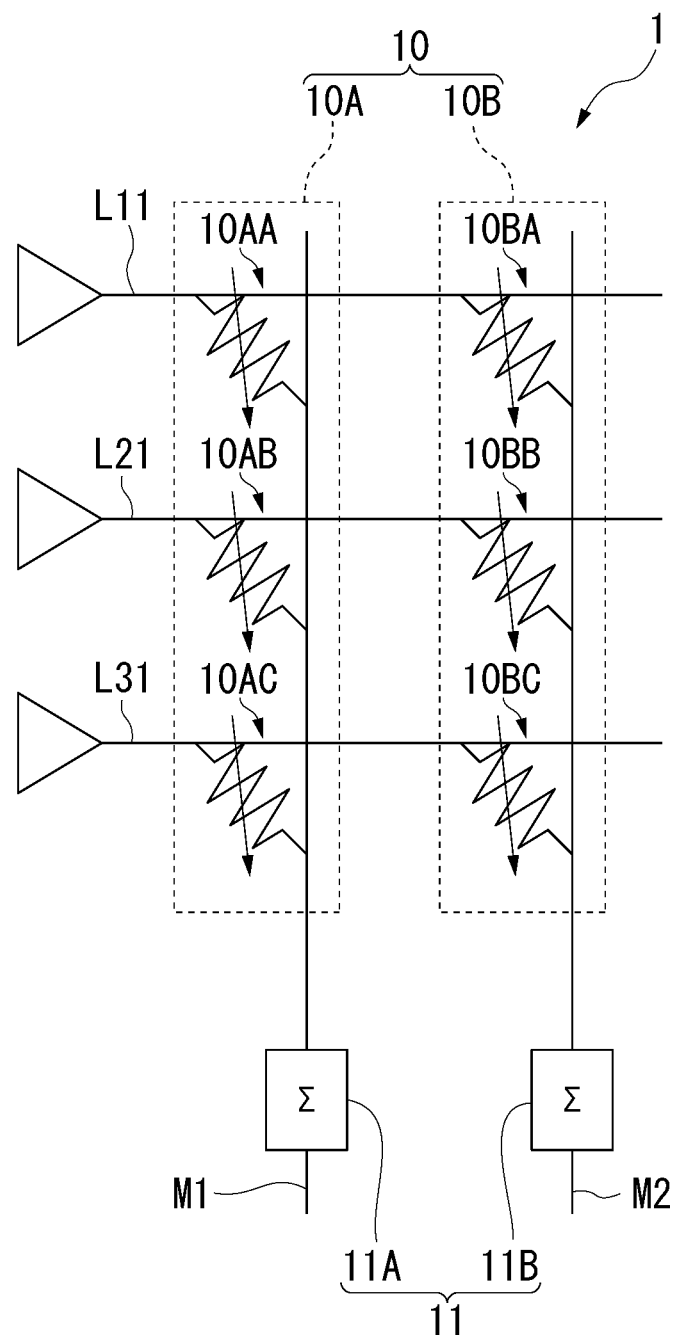
FIG. 8 is a diagram showing an example of a partial configuration of a product-sum operation device of a second embodiment.

FIG. 8 is a diagram showing an example of a partial configuration of the product-sum operation device 1 of the second embodiment.

In the product-sum operation device 1 of the first embodiment, the product operation elements 10AA to 10AC and 10BA to 10BC are constituted by magnetoresistive effect elements. On the other hand, in the product-sum operation device 1 of the second embodiment, product operation elements 10AA to 10AC and 10BA to 10BC are constituted by general resistance change elements (variable resistors).

Specifically, in the example shown in FIG. 1, each of the plurality of product operation elements 10AA to 10AC and 10BA to 10BC has a read terminal, a write terminal, and a common terminal. On the other hand, in the example shown in FIG. 8, each of the plurality of product operation elements 10AA to 10AC and 10BA to 10BC has a first terminal and a second terminal.

In the example shown in FIG. 8, the first terminals of the product operation elements 10AA and 10BA are connected to a line L11, respectively. The first terminals of the product operation elements 10AB and 10BB are connected to a line L21, respectively. The first terminals of the product operation elements 10AC and 10BC are connected to a line L31, respectively.

The second terminals of the product operation elements 10AA, 10AB, and 10AC are connected to a line M1, respectively. The second terminals of the product operation elements 10BA, 10BB, and 10BC are connected to a line M2, respectively.

A sum operator 11 includes an output detector 11A that detects the sum of outputs from the second terminals of the product operation elements 10AA, 10AB, and 10AC and an output detector 11B that detects the sum of outputs from the second terminals of the product operation elements 10BA, 10BB, and 10BC.

Although embodiments of the present invention have been described above in detail with reference to the drawings, the specific configurations thereof are not limited to those of the embodiments and also include various modifications and substitutions without departing from the spirit of the present invention. The specific configurations may also include combinations of the configurations described in the above embodiments.

For example, a program for realizing the functions of each device (for example, the product-sum operation device 1) according to the embodiments shown above may be recorded on a computer-readable recording medium (storage medium) and a computer system may be caused to read and execute the program recorded on the recording medium to perform the processing.

The "computer system" referred to here may include an operating system (OS) or hardware such as peripheral devices.

The "computer-readable recording medium" refers to a portable medium such as a flexible disk, a magneto-optical disk, a read-only memory (ROM), a writable nonvolatile memory such as a flash memory, or a digital versatile disc (DVD), or a storage device such as a hard disk provided in a computer system. The recording medium may be, for example, a recording medium that temporarily records data.

It is assumed that the "computer-readable recording medium" includes one that holds the program for a certain period of time, like a volatile memory (for example, a dynamic random-access memory (DRAM)) provided in a computer system which serves as a server or a client when the program has been transmitted via a network such as the Internet or a communication line such as a telephone line.

The program may also be transmitted from a computer system in which the program is stored in a storage device or the like to another computer system via a transmission medium or by transmission waves in the transmission medium. Here, the "transmission medium" for transmitting the program refers to a medium having a function of transmitting information, like a network (a communication network) such as the Internet or a communication line (a communication wire) such as a telephone line.

The program may be one for realizing some of the above-described functions. The program may also be a so-called differential file (differential program) which can realize the above-described functions in combination with a program already recorded in the computer system.

In a computer, for example, a processor such as a central processing unit (CPU) reads and executes the program stored in a memory.

REFERENCE SIGNS LIST

1 Product-sum operation device
2 Product-sum operation device
10 Product operator
10A Column
10AA Product operation element
10AB Product operation element
10AC Product operation element
10B Column
10BA Product operation Element
10BB Product operation element
10BC Product operation element
11 Sum operator
11A Output detector
11B Output detector
12 Malfunction determiner
13 Function replacer
14 Malfunction location-identifying unit
15 Input blocker
16 Output blocker
100 Neuromorphic device
101 Input layer
101A, 101B, 101C, 101D Node
102 Hidden layer
102A, 102B, 102C Node
103 Output layer
103A, 103B, 103C Node
A Magnetoresistive effect element
AA Write terminal
AB Common terminal
AC Read terminal
A1 Magnetization free layer
A11 First region
A12 Second region
A2 Magnetization fixed layer
A3 Nonmagnetic layer
DW Domain wall
L11 Line
L12 Line
L21 Line
L22 Line
L31 Line
L32 Line
M1 Line
M2 Line

What is claimed is:

1. A product-sum operation device comprising a product operator, a sum operator, and a malfunction determiner,
    wherein the product operator includes a plurality of product operation elements connected to same line connected to the sum operator,
    each of the plurality of product operation elements is a resistance change element,
    the sum operator includes an output detector configured to detect a sum of outputs from the plurality of product operation elements,
    the malfunction determiner is configured to determine that a malfunction has occurred in at least one of the plurality of product operation elements when the sum detected by the output detector exceeds a specified value, and
    the specified value is a value equal to or greater than a maximum value of the sum that can be detected by the output detector when the plurality of product operation elements all operate normally.

2. The product-sum operation device according to claim 1, wherein the resistance change element has a write terminal, a common terminal, and a read terminal.

3. The product-sum operation device according to claim 1, wherein the resistance change element is a magnetoresistive effect element exhibiting a magnetoresistive effect, and
    the magnetoresistive effect element includes:
    a magnetization free layer having a domain wall;

a magnetization fixed layer whose magnetization direction is fixed; and a nonmagnetic layer sandwiched between the magnetization free layer and the magnetization fixed layer.

4. The product-sum operation device according to claim 1, wherein the product operator includes at least a first column having the plurality of product operation elements and a second column having a plurality of product operation elements connected to the same line different from the first column, the sum operator includes at least a first output detector configured to detect a sum of outputs from the plurality of product operation elements in the first column and a second output detector configured to detect a sum of outputs from the plurality of product operation elements in the second column, and the product-sum operation device further comprises a function replacer configured to, when the malfunction determiner has determined that the first column has malfunctioned, cause the plurality of product operation elements in the second column to operate product operations that the plurality of product operation elements in the first column have operated before the malfunction of the first column.

5. The product-sum operation device according to claim 1, further comprising:

a malfunction location-identifying unit configured to identify, when the malfunction determiner has determined that some of the plurality of product operation elements have malfunctioned, a malfunctioning product operation element among the plurality of product operation elements; and an input blocker configured to block an input to the malfunctioning product operation element when the malfunction determiner has determined that some of the plurality of product operation elements have malfunctioned, wherein the malfunction location-identifying unit is configured to identify the malfunctioning product operation element by inputting a signal to the plurality of product operation elements through an output side of the plurality of product operation elements.

6. A neuromorphic device comprising the product-sum operation device according to claim 1.

7. The neuromorphic device according to claim 6, further comprising an activation function received to the output of the product-sum operation device, wherein the activation function is set such that an output value from the activation function becomes zero when a value input to the activation function is equal to or greater than a threshold value.

8. The neuromorphic device according to claim 6, wherein a resistance value of each of the plurality of product operation elements during normal operation and a resistance value of each of the plurality of product operation elements during a malfunction differ by three or more orders of magnitude.

9. The neuromorphic device according to claim 6, wherein the output detector is configured to detect an output current value from the plurality of product operation elements.

10. The neuromorphic device according to claim 6, wherein the output detector is configured to detect a charge output from the plurality of product operation elements.

11. A neuromorphic device comprising the product-sum operation device according to claim 1, the product-sum operation device further comprising an output blocker configured to block, when the malfunction determiner has determined that some of the plurality of product operation elements have malfunctioned, outputs from the plurality of product operation elements determined to have malfunctioned.

12. A neuromorphic device comprising the product-sum operation device according to claim 1, wherein the resistance change element is a magnetoresistive effect element exhibiting a magnetoresistive effect, the magnetoresistive effect element includes:

a magnetization free layer having a domain wall;

a magnetization fixed layer whose magnetization direction is fixed; and a nonmagnetic layer sandwiched between the magnetization free layer and the magnetization fixed layer, and a thickness of the nonmagnetic layer is 2.5 nm or more.

13. The neuromorphic device according to claim 12, wherein the magnetization free layer is a perpendicular magnetization film selected from the group consisting of a Co/Pt multilayer film, a Co/Pd multilayer film, and a CoCrPt alloy film.

14. The product-sum operation device according to claim 1, further comprising:

a malfunction location-identifying unit configured to identify, when the malfunction determiner has determined that at least one of the plurality of product operation elements have malfunctioned, a malfunctioning product operation element among the plurality of product operation elements;

wherein the malfunction location-identifying unit is configured to identify the malfunctioning product operation element by inputting a signal to the plurality of product operation elements through an output side of the plurality of product operation elements.

15. A method for determining a malfunction in a product-sum operation device including a product operator and a sum operator, wherein the product operator includes a plurality of product operation elements connected to same line connected to the sum operator, each of the plurality of product operation elements is a resistance change element, the method comprises:

a detection step of detecting a sum of outputs from the plurality of product operation elements, and a determination step of determining that a malfunction has occurred in at least one of the plurality of product operation elements when the sum detected in the detection step exceeds a specified value, and the specified value is a value equal to or greater than a maximum value of the sum that can be detected when the plurality of product operation elements all operate normally.

* * * * *